United States Patent
Park et al.

(10) Patent No.: US 6,198,982 B1
(45) Date of Patent: Mar. 6, 2001

(54) METHOD AND APPARATUS FOR DETECTING THE PRESENCE OF PARTICLES ON A WAFER HOLDER OF SEMICONDUCTOR EXPOSURE EQUIPMENT

(75) Inventors: Soon-jong Park; Jong-soon Yun, both of Yongin (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/083,888

(22) Filed: May 26, 1998

(30) Foreign Application Priority Data

Jun. 5, 1997 (KR) .................................................. 97-23444

(51) Int. Cl.$^7$ ...................................................... G06F 19/00
(52) U.S. Cl. .......................... 700/121; 356/237.3; 716/21
(58) Field of Search .................................. 700/121, 110, 700/60; 716/21; 324/765; 356/237.3

(56) References Cited

U.S. PATENT DOCUMENTS

| | | | | |
|---|---|---|---|---|
| Re. 33,991 | * | 7/1992 | Shiba et al. .......................... | 417/502 |
| 4,641,967 | * | 2/1987 | Pecen ................................. | 356/237.3 |
| 4,849,901 | * | 7/1989 | Shimizu ............................. | 700/121 |
| 5,291,239 | * | 3/1994 | Jackson ............................. | 355/53 |
| 5,311,275 | * | 5/1994 | Taniguchi et al. ............... | 356/237.3 |
| 5,361,122 | * | 11/1994 | Kataoka et al. ................... | 355/53 |
| 5,365,051 | * | 11/1994 | Suzuki et al. ..................... | 250/201.2 |
| 5,422,724 | * | 6/1995 | Kinney et al. ..................... | 356/375 |
| 5,483,056 | * | 1/1996 | Imai .................................... | 250/201.4 |
| 5,673,208 | * | 9/1997 | Meier et al. ........................ | 702/179 |
| 5,913,105 | * | 6/1999 | McIntyre et al. ................. | 438/16 |
| 5,940,175 | * | 8/1999 | Sun ..................................... | 356/237.3 |
| 5,963,315 | * | 10/1999 | Hiatt et al. ......................... | 356/237.3 |
| 6,011,619 | * | 1/2000 | Steffan et al. ..................... | 356/237.3 |

* cited by examiner

Primary Examiner—Paul P. Gordon
Assistant Examiner—Edward F. Gain, Jr.
(74) Attorney, Agent, or Firm—Jones Volentine, LLC

(57) ABSTRACT

The presence of particles on the wafer holder of semiconductor exposure equipment is detected by analyzing any up-and-down movement of the stage during the alignment, for exposure, of a wafer mounted on the wafer holder. The analysis of the up-and-down movement of the stage is conducted based on signals from a motor which moves the stage in the vertical (Z-axis) direction, or based on signals from a sensor indicative of the distance that the stage deviates vertically from a reference position. A feedback mechanism produces information representative of the up-and-down movement of the stage, and a computer processes the signals to produce data indicative of whether particles are present beneath the wafer on the stage. The feedback mechanism can be either a feedback loop from the control of the motor which moves the stage in the direction of the Z axis, or from a sensor which senses the position of the surface of the wafer at a fixed location where specific portions of the wafer are brought for alignment in preparation of their exposure. The computer includes an input device for inputting the signals as analog signals, a processor which processes the analog signals to generate data indicative of whether particles are present on the wafer holder, and an output device for outputting the data as digital signals.

11 Claims, 7 Drawing Sheets

METHOD AND APPARATUS FOR DETECTING THE PRESENCE OF PARTICLES ON A WAFER HOLDER OF SEMICONDUCTOR EXPOSURE EQUIPMENT

BACKGROUND OF THE INVENTION

1. Field of the Invention

The present invention relates to semiconductor exposure equipment which irradiates a wafer with light passed through a design pattern in order to expose a photoresist on the wafer to the design pattern. More particularly, the present invention relates to a method of and apparatus for detecting the presence of particles on a wafer holder of the semiconductor equipment which supports the wafer, and to a method of determining whether the presence of such particles is significant enough to constitute a defect.

2. Description of the Related Art

Generally, when manufacturing semiconductor devices, photomasking is used to transfer a semiconductor design pattern onto a wafer. This is achieved by first depositing photoresist on a wafer. Then the wafer/resist combination is inserted into a mask aligner, which contains the optics, ultraviolet (UV) light source, and the circuit layer image contained on a mask or reticle, which is to be transferred to the resist film. The mask or reticle pattern image can be transferred to the wafer on a scale of one-to-one, or at a reduced scale using projection optics to focus and reduce the image.

The exposure equipment (mask aligner) also contains a wafer holder for mounting the wafer thereon. The wafer holder itself is disposed on a stage, with the stage being driven by a motor or other driving device. After the wafer is mounted on the wafer holder, the reticle and wafer are aligned by driving the stage. Then, the design pattern is transferred onto the photoresist of the wafer using a light source which irradiates the reticle, and a reduction projection lens through which the light is passed to the wafer.

It is common for registration tolerances in high density chips to be on the order of ±2000 Å. The total exposure energy is the combination of light intensity and exposure time, which must be tightly controlled to assure proper image reproduction.

However, this exposure process is often carried out while particles inadvertently remain on the wafer holder beneath the wafer, which can not be detected by conventional methods. Because the exposure process is carried out repeatedly, an accumulation of particles on the stage often results in some malfunction of the exposure equipment. Accordingly, the particles may also cause a mass of defects in the final semiconductor devices or, at the every least, may adversely affect the production yield.

SUMMARY OF THE INVENTION

An object of the invention, therefore, is to substantially overcome the problems, limitations and disadvantages in the prior art by providing a method of and apparatus for detecting the presence of particles beneath a wafer on the wafer holder of semiconductor exposure equipment.

To achieve this and other objects, the present invention provides a method of detecting the presence of particles on the wafer holder of semiconductor exposure equipment characterized by a step of analyzing any up-and-down movement of the stage supporting the wafer holder during the wafer alignment step(s) to determine whether particles are present on the wafer holder beneath the wafer.

The analysis of the up-and-down movement of the stage is conducted based on signals from a motor which moves the stage in the vertical (Z-axis) direction, or based on signals from a sensor indicative of the distance that the stage deviates vertically from a reference position. Preferably, the signals are voltage signals generated at the time a shutter of the exposure equipment has opened.

The present invention also provides a method of determining a defect caused by the presence of particles on the wafer holder during the exposure of a wafer in the manufacture of a semiconductor device. In this case, as respective portions of the wafer are aligned for exposure, each portion is checked for the presence of particles therebelow according to the method outlined above. The number of respective portions of the wafer which are determined to have a particle(s) therebelow is tracked. When this number reaches a predetermined value, it is judged that the presence of the particles is so serious as to constitute a fatal defect.

The present invention also provides an apparatus for detecting the presence of particles on the wafer holder of semiconductor exposure equipment, the apparatus including feedback means for producing signals representative of the up-and-down movement of the stage, and processing means for processing the signals in a manner that produces data indicative of whether particles are present on the wafer holder beneath the wafer.

The feedback means can be either a feedback loop (of a type well known to those of ordinary skill in the art) from the control of the motor which moves the stage in the direction of the Z axis, or a sensor which senses the position of the surface of the wafer at a fixed location where specific portions of the wafer are brought for alignment in preparation of their exposure. The processing means includes an input device for inputting the signals as analog signals, a computer processor which processes the analog signals to generate data indicative of whether particles are present on the stage, and an output device for outputting the data as digital signals.

The feedback means may be provided for each of several sets of exposure equipment. In this case, the input device of the processing means is connected to each feedback means. That is, the processing means may be connected to at least two sets of exposure equipment so that the processor can simultaneously monitor the exposure of several wafers at a time for the presence of potentially harmful particles.

BRIEF DESCRIPTION OF THE DRAWINGS

These and other objects, features and advantages of the present invention will be described with reference to the accompanying drawings, in which.

DETAILED DESCRIPTION OF THE PREFERRED EMBODIMENTS

First, a preferred embodiment of the present invention will be generally described with respect to the accompanying drawings.

Figure 1:
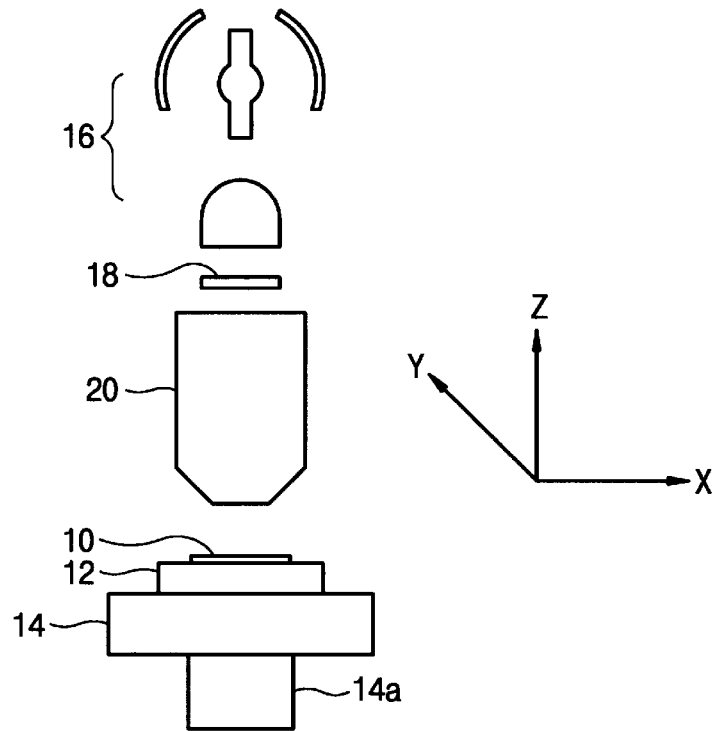
FIG. 1 is a schematic diagram of exposure equipment of a semiconductor device fabrication system.

Referring to FIG. 1, the exposure equipment of a semiconductor fabrication system comprises a wafer holder 12, on which a wafer 10 is mounted, and a stage 14 supporting the wafer holder 12. The stage 14, and hence the wafer holder 12 thereon, are movable along X, Y and Z axes (as oriented with reference to FIG. 1) by any suitable motor or driving device 14a. A light source 16 irradiates the wafer 10 with light through a reticle 18 having the design pattern formed thereon in order to transfer a semiconductor design pattern onto the wafer 10. A reduction projection lens 20 projects the design pattern of the reticle 18 onto the wafer 10.

Figure 3:
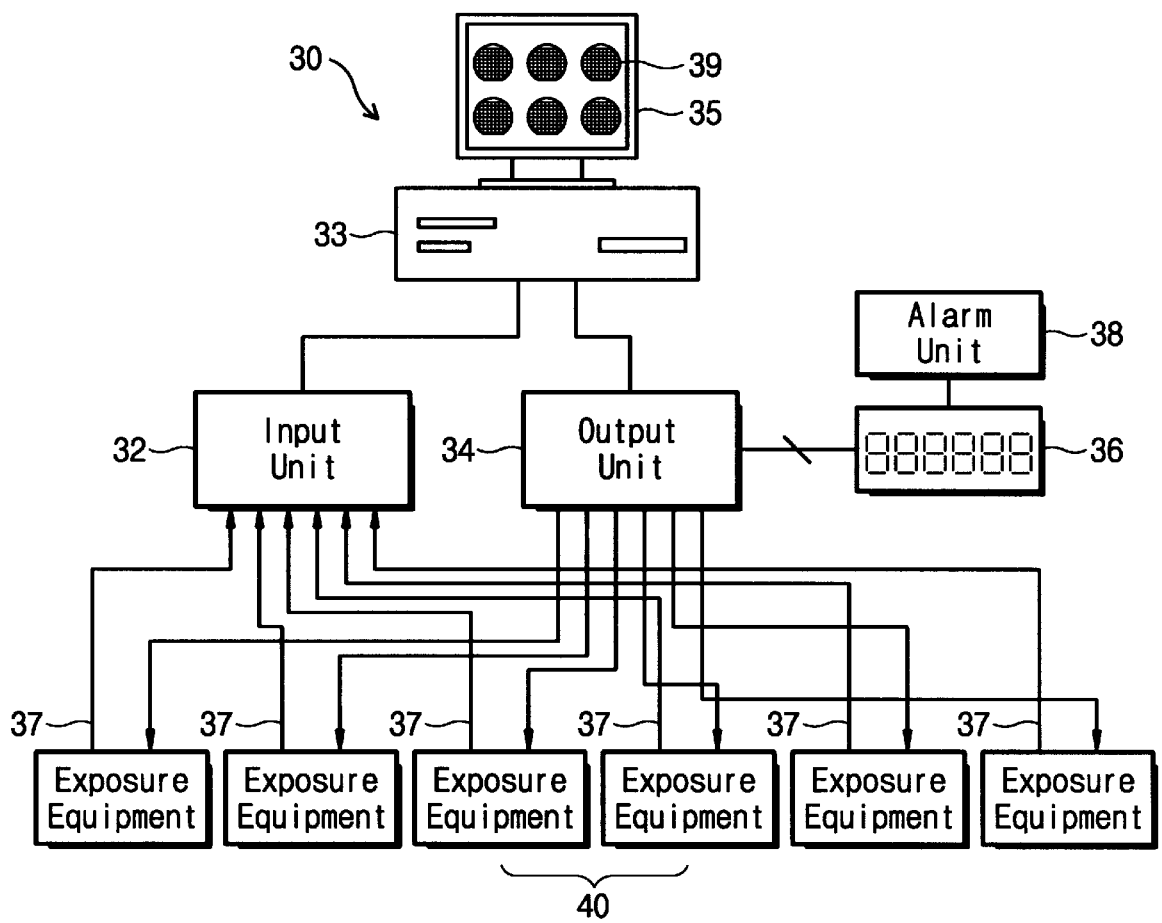
FIG. 3 is a schematic diagram of one embodiment of the apparatus for detecting the presence of particles on the wafer holder of semiconductor exposure equipment according to the present invention.

FIG. 3 shows a processing means 30 for determining, based on the up-and-down (Z axis) movement of the wafer holder 12, whether a specific location on the wafer holder 12 deviates from a reference (ideal) location. The processing means 30 comprises an input unit 32 (analog converter) for inputting a signal representative of the deviation as an analog signal, a microprocessor 33 to which the analog signal is input, and an output unit 34 (digital converter) for outputting data from the microprocessor 33 as a digital signal. A display monitor 35 is also connected to the microprocessor 33.

In addition, an error display unit 36 displays a numeral indicative of an error derived from the processing means 30, and an alarm unit 38 issues an alarm when a given magnitude of the error is derived and displayed. The error display unit 36 is connected to the output unit 34, and the alarm unit is connected to the error display unit 36.

The input unit 32 of the processing means 30 of the present invention is connected to the semiconductor exposure equipment 40 through a feedback device represented by reference numeral 37 in FIG. 3. The processing means 30 can be connected to at least two sets of the exposure equipment 40 via its input unit 32. In the illustrated embodiment, the processing means 30 is connected to six different sets of exposure equipment 40.

Figure 4:
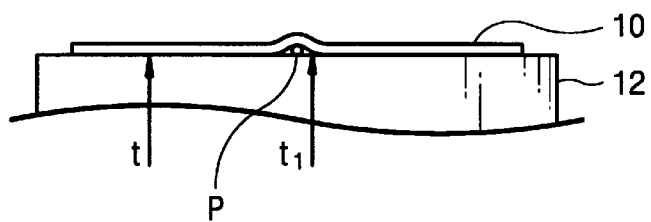
FIG. 4 is a side view of a wafer showing a particle thereon beneath the wafer, and the presence of which is to be detected according to the present invention.

FIG. 4 shows the wafer 10 mounted to the wafer holder 12 on which a particle(s) P has remained. The deviation (t1) at a specific portion of the wafer holder 12 where a particle (s) P remains is greater than that (t) at a portion of the wafer holder 12 where no particles remain, the deviation referring to the distance along the Z axis between a surface of the wafer at the portion of the wafer holder in question and some fixed reference position on the wafer holder.

Figure 6:
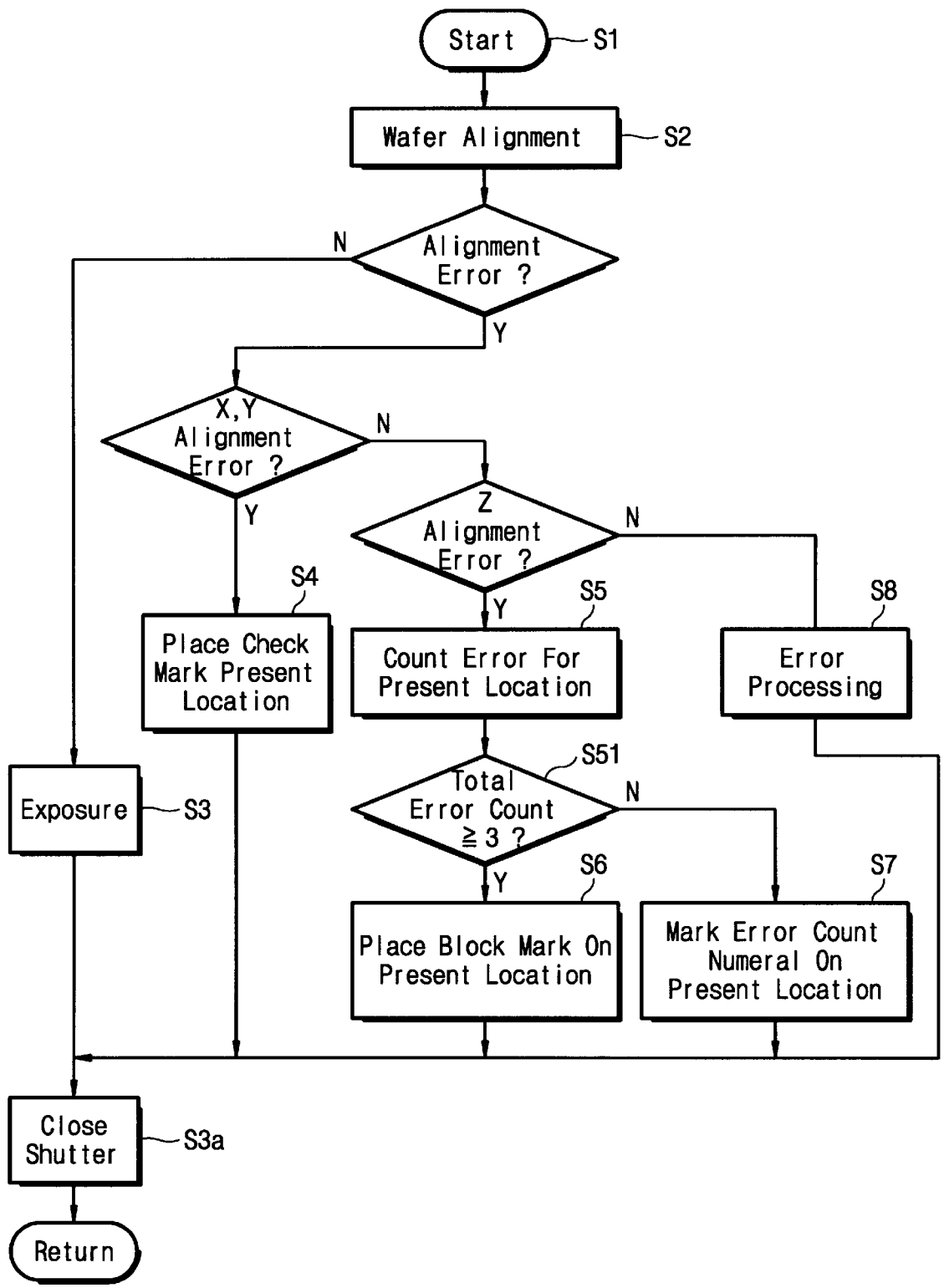
FIG. 6 is a flow chart of one embodiment of the method of detecting the presence of particles on the wafer holder of the semiconductor exposure equipment according to the present invention.

FIG. 6 shows the method of detecting the presence of particles P on the wafer holder 12. Generally, the method comprises the steps of mounting the wafer 10 on the wafer holder 12; aligning the wafer 10 and the reticle 18 in the directions of the X, Y and Z axes; based on the up-and-down movement of the wafer holder 12 in the direction of the Z axis during the alignment step, determining locations on the wafer holder 12 where the wafer holder 12 deviates from a reference position at the time a portion of the wafer above that location on the stage was aligned; counting the number of locations where such a deviation occurred; summing these values; and displaying these locations where the deviations occur.

The results of the counting step are displayed as a numeral or integer on the error display unit 36, whereas the locations corresponding to the wafer are displayed on a wafer map 39 which can, as shown in FIG. 3, be displayed on the monitor 35 of the processing means 30. As shown in the wafer map 39 of FIG. 8, each time a portion of the wafer 10 is determined to have a particle therebelow, a corresponding portion of the wafer map is marked with a numeral, e.g., with the integer "1" at the location where the first deviation is detected, with a integer "2" at the next location where a deviation is detected, and so forth.

Figure 2:
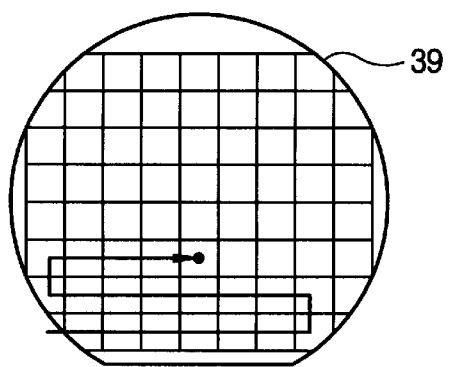
FIG. 2 is a diagram of a wafer map (representation of a wafer) showing the path along which respective portions of the wafer are irradiated by the exposure equipment of FIG. 1.
Figure 7:
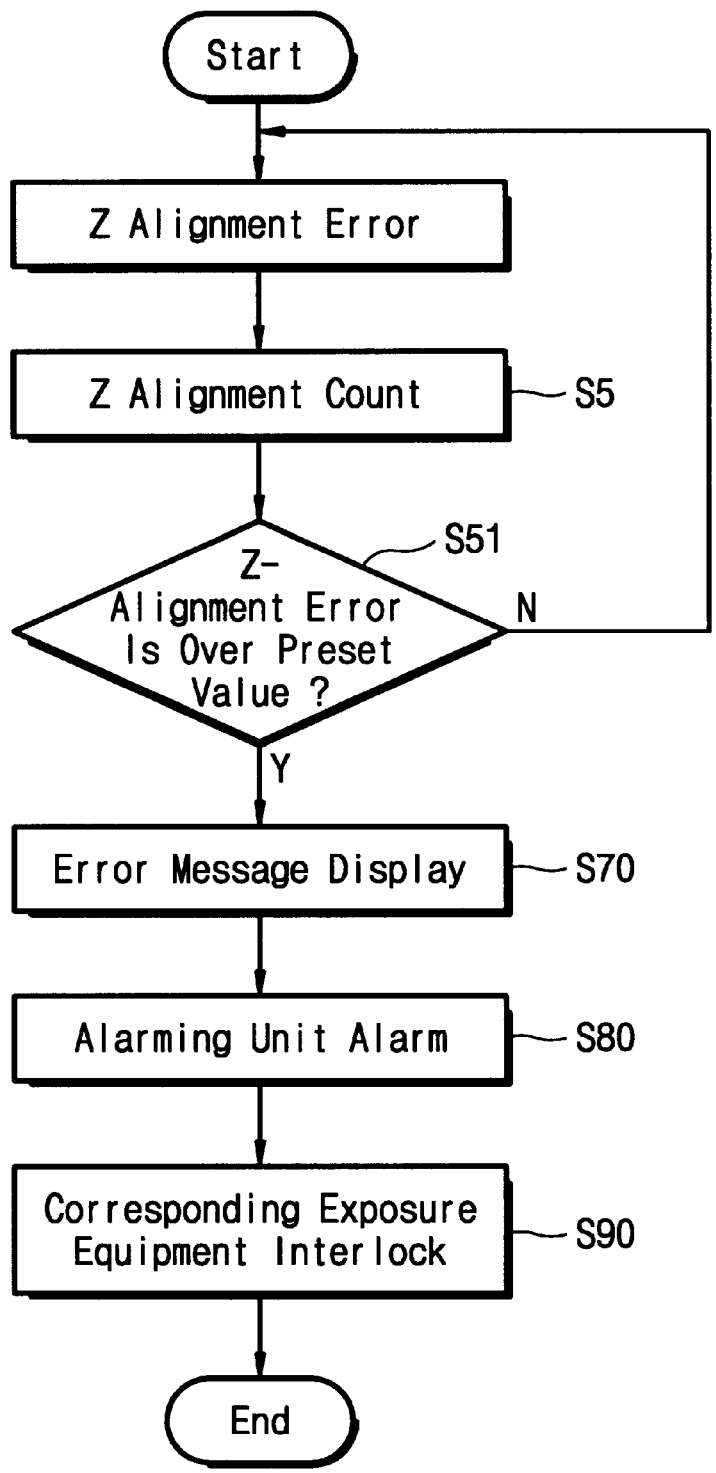
FIG. 7 is a flow chart of a portion of a method of determining whether particles on the wafer holder of semiconductor exposure equipment would create a defect according to the present invention.
Figure 8:
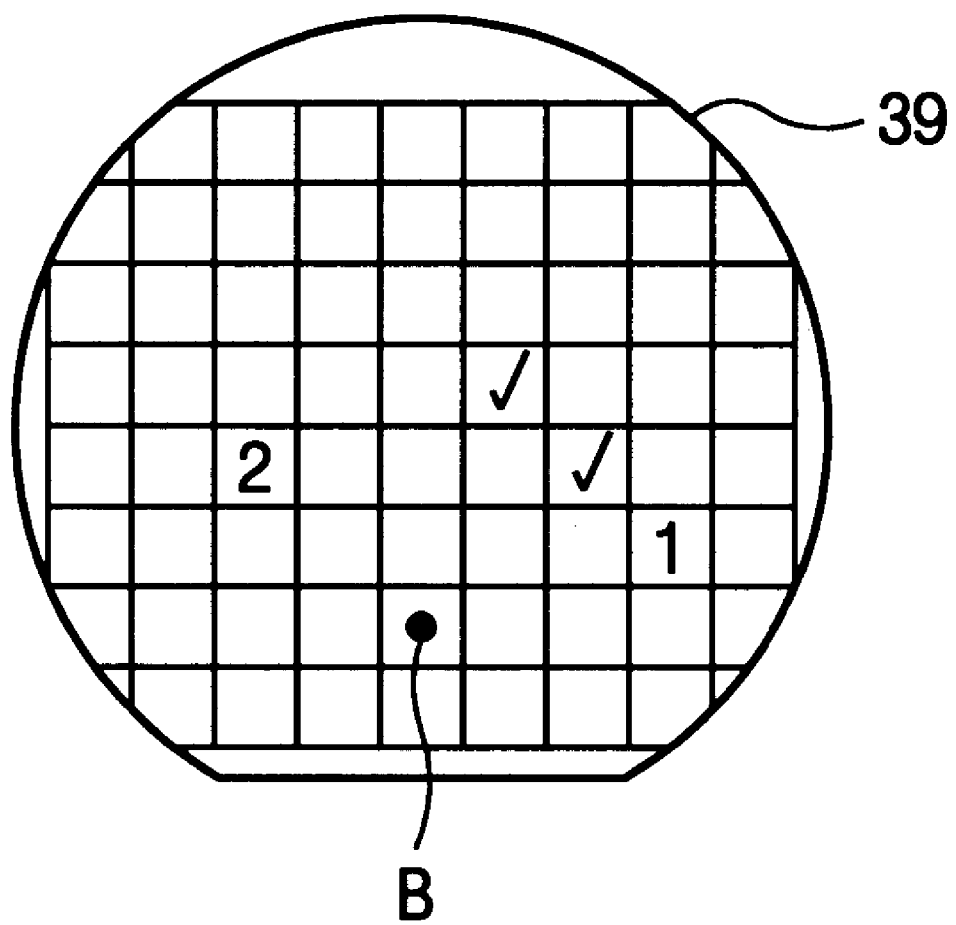
FIG. 8 is a diagram of a wafer map on which the output of the detection process according to the present invention is displayed.

Referring generally now to FIG. 7, there is shown a subroutine of a method of detecting whether the presence of particles on the wafer holder 12 would give rise to a defect, in which errors in Z-axis alignment of respective portions of the wafer 10 and the reticle 18 are counted. (Again, refer to the wafer map of FIG. 2 showing the sequence in which the respective portions of the wafer and reticle are aligned, and to FIG. 8 showing a display of the wafer map.) An error signal is generated and summed as errors are detected. Once the number of such errors exceeds a predetermined value the error signal is displayed and the alarm unit 38 is activated. Finally, the particular set of exposure equipment associated with the excessive errors is interlocked with the processing means 30 through the output unit 34, for identification and corrective action.

According to the present invention, the predetermined number of alignment errors required to cause an alarm signal to be generated is at least two, and in the preferred embodiment, is greater than three.

Now, the embodiment of the method and apparatus for detecting the presence of particles on the wafer holder of wafer exposure equipment according to the present invention will be described in more detail. The following discussion is based on a wafer being placed on a wafer holder, with the wafer holder being supported by a stage. However, one of ordinary skill in the art would understand that the same apparatus and method of particle detection of the present invention is equally applicable where the wafer is placed directly on stage (i.e., if the wafer holder is eliminated) such that particles are detected on the stage underneath the wafer.

Referring to FIG. 6, the wafer 10 is mounted on the wafer holder 12 in a start step S1. Then one portion of the wafer 10 (corresponding to one of the square sections of the wafer map 39 ) is aligned in step S2 with a corresponding portion of the reticle 18 in preparation for the exposure of such one portion. In the alignment step S2, the stage 14 drives the wafer holder 12 in the X, Y and Z axis directions, if necessary, by the motor or driving device 14a.

If there was no alignment error, namely no movement of the stage and wafer holder 12 once it was brought to a position for exposing a select portion of the wafer, the select portion of the wafer 10 is exposed in step S3, after which the shutter for the exposure equipment is closed in step S3a. Then, as shown by the wafer map 39 in FIG. 2, the process proceeds to the next portion of the wafer that is to be exposed. Incidentally, concerning the X-Y alignment of the wafer holder 12, as should be evident from FIG. 2, once Y-axis alignment is completed for a particular row, it is not necessary to carry out another Y-axis alignment for the next several portions of the wafer.

Returning to FIG. 6, if only an X-axis and/or Y-axis alignment (i.e., no Z-axis alignment) of a portion of the wafer 10 was required, a check mark is placed on the wafer map 39 (see FIG. 8) in step S4 at a location corresponding to that portion of the wafer 10.

If a deviation occurs in the direction of the Z axis, namely if abnormal up-anddown movement of the wafer holder 12 during the alignment step S2 reveals a Z-axis alignment error, it is determined that a particle(s) is present at that location where the alignment error occurred. In step S5, the error at that location is counted. If the total error count (step S51) is less than three for example, a numeral or integer (i.e., "1" or "2") representing the total count is marked (step S7) on the wafer map 39 at a location corresponding to that portion of the wafer as shown in FIG. 8. If the total error count is greater than or equal to three in step S51, a black mark B is placed at the location where the alignment error occurred.

An alignment error of the wafer in the direction of the Z-axis is determined with the aid of a feedback loop 37 from the motor or driving device 14a of the semiconductor device exposure equipment, or from the feedback provided to the processing means 30 by a photosensor 25.

Figure 9A:
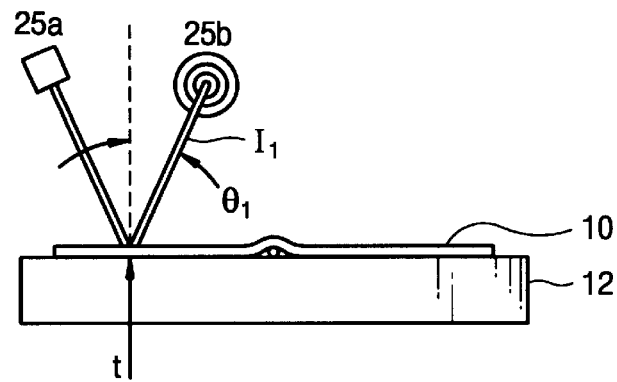
FIG. 9(a) is a schematic diagram of a feedback device showing its operation at the time a specific portion of a wafer having no particle(s) therebelow is aligned for exposure, and at which time the wafer holder is at a position coinciding with a reference position.
Figure 9B:
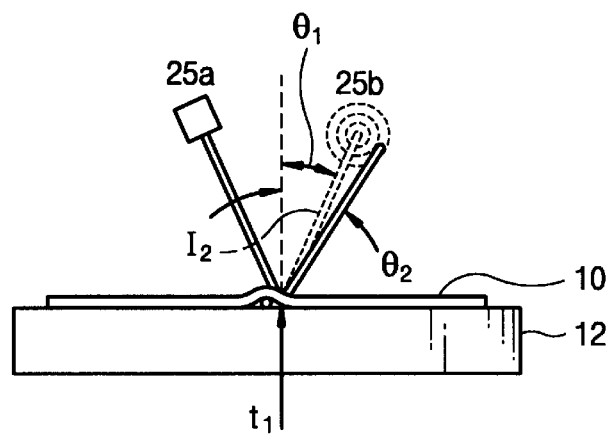
FIG. 9(b) is a schematic diagram of the feedback device showing its operation at the time where another portion of the wafer having a particle therebelow is misaligned for exposure, and at which time the wafer holder coincides with the reference position.
Figure 9C:
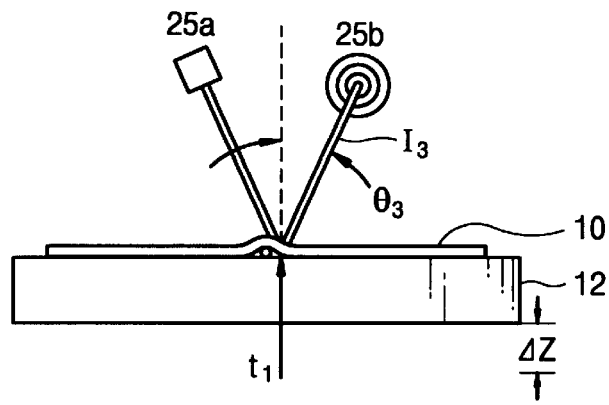
FIG. 9(c) is a schematic diagram of the feedback device showing its operation at the time the portion of the wafer referred to with respect to FIG. 9(b) is aligned for exposure, but at which time the wafer holder deviates from the reference position.

FIGS. 9a, 9b and 9c illustrate an exemplary operation of a photosensor 25. FIG. 9a schematically represents the case of (t) where the wafer holder 12 is in its reference position for ideal Z-axis alignment. Light emitted from a photoemitter 25a of a known type is reflected from the surface of the wafer 10 to a photoreceiver 25b at a certain angle ($\theta_1$) and reaches the photoreceiver 25b with a given intensity I1.

FIG. 9b schematically represents the case of (t1) where the wafer holder 12 is in the same reference position and therefore, a Z-axis misalignment is occurring. When a deviation of the wafer surface such as that shown at (t1) occurs, the intensity of the light 12 (dashed lines) received by the photoreceiver 25b differs, due to the different angle of reflection ($\theta_2$) of the light (solid line), from that received when the wafer is at an exposure position (t) where no deviation occurs ($\theta_1$). In other words, the intensity I2 of the light received by the photoreceiver 25b is reduced since the light is scattered somewhat, depicted as the different solid and dashed lines, due to the uneven surface at the position of the particle underneath the wafer 10.

FIG. 9c shows that the wafer holder 12 has been moved in the Z-axis direction by a distance ΔZ, based on information generated by the photosensor 25, to a position where the intensity I3 of the light received by the photoreceiver 25b at an angle ($\theta_3$) is equal to the intensity I1 of the light received by the photoreceiver 25b at angle ($\theta_1$) as shown in FIG. 9a.

Therefore, not only is the photosensor 25 used for the alignment of the wafer 10 in the Z-axis direction, but for generating a signal representative of the need to have moved the wafer holder 12 up or down in the Z-axis direction relative to a reference position such as the one depicted in FIG. 9(a). Alternately, the signal representative of the need to move the wafer holder 12 up or down in the Z-axis direction relative to a reference position can be generated by the motor that is moving the stage.

Figure 5:
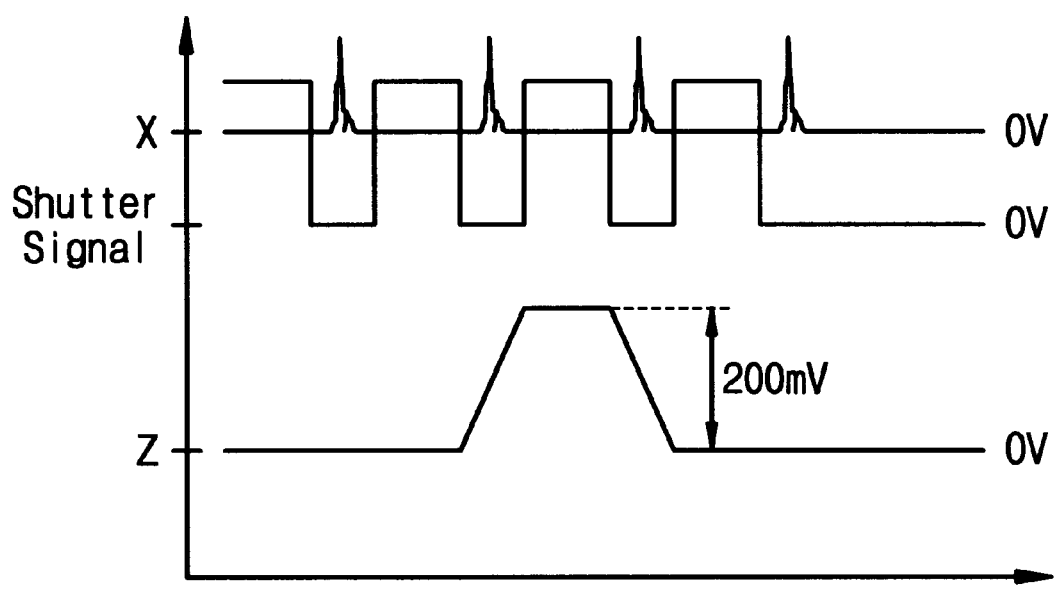
FIG. 5 is a graphical representation of the waveforms of signals produced according to the present invention.

This alignment signal, indicative of the location where a Z-axis deviation has occurred, is input to the processing means 30 as an analog signal by the input unit 32. That is, referring now to FIG. 5, the microprocessor 33 of the processing means 30 analyzes the voltage of the input analog signal, and, for example, if the voltage is in excess of 200 mV, the misalignment is judged to be abnormal, indicating that a particle(s) is present under that portion of the wafer being exposed. In FIG. 5, the signal whose voltage is analyzed begins being generated by the input unit 32 at the time a shutter of the exposure equipment opens.

As shown in FIG. 7, once the abnormal deviation or Z alignment error signal is processed, the output unit 34 counts or sums the number of abnormal deviations (S5) which is equal to the number of portions of the wafer that experience Z-axis misalignment, and displays this number on the error display unit 36 (S70) if more than a predetermined number of errors are detected (S51). For example, if two, or preferably three abnormalities are determined in connection with deviations of portions of a single wafer 10, the processing means 30 activates the alarm unit 38 (S80) through the output unit 34, and interlocks the exposure equipment 40 (S90) that was processing the wafer responsible for the alarm. The processing means also places a mark of a specific color, such as black, on the wafer map (see Step S6 in FIG. 6) at a location corresponding to the portion of the wafer where the abnormal deviation triggered the alarm. Note that the error display unit 36 could be designed to incrementally show the number of errors numerically, or just show when the predetermined number of errors has been detected.

As shown in step S8 of FIG. 6, if an alignment error was determined to be present, but the processing means was unable to correlate the error with a misalignment in the X, Y or Z axis direction, the processing means executes an analysis of the error.

The present invention thus provides numerous advantages. Particles on the surface of the wafer holder underneath the wafer are detected by the vertical movement of the stage supporting the wafer holder and wafer. This prevents irregularities in the exposure process and accordingly improves device yields. Also, by displaying the location of the deviation on a wafer map, the exact location of the particles can be identified. The operator is also alerted of if the presence of such particles is significant enough to constitute a defect.

Although the present invention has been described in detail, it should be noted that various changes, substitutions and modifications can be made thereto without departing from the spirit and scope of the invention as defined by the appended claims.

What is claimed is:

1. A method of determining a defect caused by the presence of particles on a wafer holder mounted on a stage during the exposure of a wafer in the manufacture of a semiconductor device, said method comprising the steps of:

mounting a wafer on the wafer holder, the stage capable of being moved in directions along X and Y axes perpendicular to one another, and up and down along a Z axis perpendicular to the X and Y axes;

moving the stage over distances in the directions of the X, Y and Z axes necessary to align, for exposure, a portion of the wafer with a design pattern provided on an optical element of the exposure equipment;

once the portion of the wafer is aligned with the design pattern, exposing that portion of the wafer to light passing through the design pattern;

subsequent to said step of exposing, repeating said step of aligning with another portion of the wafer;

generating information indicative of the movement of the stage in the direction of the Z axis for each time a portion of the wafer is aligned for exposure;

for each portion of the wafer aligned with the design pattern, analyzing the information generated for that portion of the wafer to determine whether a particle is present on the wafer holder beneath that portion of the wafer; and counting the number of times a particle is determined to be present on the wafer holder beneath a respective portion of the wafer.

2. The method of determining a defect during the exposure of a wafer in the manufacture of a semiconductor device as claimed in claim 1, further comprising a step of displaying an incremental numeral indicative of said number of times as said counting is carried out.

3. The method of determining a defect during the exposure of a wafer in the manufacture of a semiconductor device as claimed in claim 2, wherein said step of displaying further comprises marking a wafer map in the form of a pictorial representation of the wafer.

4. The method of determining a defect during the exposure of a wafer in the manufacture of a semiconductor device as claimed in claim 3, wherein the marking of the wafer map is carried out by placing the incremental numeral on portions of the wafer map corresponding to portions of the wafer beneath which a particle has been determined to be present.

5. The method of determining a defect during the exposure of a wafer in the manufacture of a semiconductor device as claimed in claim 3, wherein the marking is carried out by coloring a portion of the wafer map corresponding to that portion of the wafer where the defect in the process was determined to have occurred.

6. The method of determining a defect during the exposure of a wafer in the manufacture of a semiconductor device as claimed in claim 1, wherein said step of moving comprises operating a motor to move the stage in the direction of the Z axis when necessary, and said step of generating information comprises generating feedback from the motor which moves the stage in the direction of the Z axis, and said step of analyzing comprises processing the feedback.

7. The method of determining a defect during the exposure of a wafer in the manufacture of a semiconductor device as claimed in claim 1, wherein said step of generating information comprises sensing the movement of the stage in the direction of the Z axis; and said step of analyzing comprises establishing a reference position for the stage, and analyzing the sensed information to determine the distance the stage has moved in the direction of the Z axis relative to the reference position.

8. The method of determining a defect during the exposure of a wafer in the manufacture of a semiconductor device as claimed in claim 1, wherein said step of analyzing includes producing a voltage signal representative of the movement of the stage in the direction of the Z axis.

9. The method of determining a defect during the exposure of a wafer in the manufacture of a semiconductor device as claimed in claim 1, wherein said step of counting comprises producing a digital signal.

10. The method of determining a defect during the exposure of a wafer in the manufacture of a semiconductor device as claimed in claim 1, further comprising a step of activating an alarm if said number of times in said counting step is greater than a predetermined value.

11. The combination of semiconductor wafer exposure equipment, and apparatus for detecting the presence of particles on a wafer holder beneath a wafer aligned for exposure, the combination comprising:

a wafer holder having a wafer thereon, the wafer holder supported by a stage for movement in directions along X and Y axes perpendicular to one another, and up and down along a Z axis perpendicular to the X and Y axes;

a light source supported above said stage;

an optical element bearing a semiconductor design pattern, said optical element being supported in an optical path of the exposure equipment between said light source and said stage;

a driving device for moving the stage over distances in the directions of the X, Y and Z axes necessary to align, for exposure, a portion of the wafer with said design pattern;

feedback means for generating feedback indicative of the movement of the stage in the direction of the Z axis; and processing means for analyzing the feedback to determine whether particles are present on the wafer holder beneath the wafer;

a display connected to said processing means so as to display information indicative of the presence of particles on said wafer holder;

wherein said processing means comprises an input unit connected to said feedback means so as to produce analog signals from the feedback a processor connected to the input unit so as to process the analog signals into data determinative of whether particles are present on said wafer holder beneath a wafer, and an output unit connected to the processor so as to convert the data into digital signals; and wherein said processor produces summed data of a successive number of times particles are determined to be present under respective portions of a wafer mounted on said wafer holder, and said display is a numerical digital readout on which said number is displayed.

* * * * *